United States Patent [19]

Fukuda

[11] 4,054,897
[45] Oct. 18, 1977

[54] SEMICONDUCTOR DEVICE WITH HIGH FREQUENCY, HIGH POWER OUTPUT

[75] Inventor: Masumi Fukuda, Kobe, Japan

[73] Assignee: Fujitsu Ltd., Kawasaki, Japan

[21] Appl. No.: 611,418

[22] Filed: Sept. 8, 1975

Related U.S. Application Data

[63] Continuation of Ser. No. 114,371, Feb. 10, 1971, abandoned, which is a continuation of Ser. No. 688,493, Dec. 6, 1967, abandoned.

[30] Foreign Application Priority Data

Dec. 9, 1966   Japan .................................. 41-80829

[51] Int. Cl.² ........................................... H01L 29/72
[52] U.S. Cl. ................................................... 357/36
[58] Field of Search ......................................... 357/36

[56] References Cited

U.S. PATENT DOCUMENTS

| 3,457,631 | 7/1969 | Hall et al. | 29/578 |
| 3,922,706 | 11/1975 | Kaiser | 357/36 |

Primary Examiner—Martin H. Edlow
Attorney, Agent, or Firm—Herbert L. Lerner

[57] ABSTRACT

A transistor has an emitter region embedded into a surface zone of the adjacent base region and shaped as a mesh-grid structure in whose many meshes a number of respective base portions emerge at the surface, each of these base portions being individually surrounded by the mesh configuration. The just-mentioned surface is coated with an insulating film, such as a coating of silicon dioxide, which has openings above the emitter mesh grid as well as above the base portions. Two mutually insulated metal layers, preferably of vapor-deposited aluminum, overlay the insulating film and are in ohmic contact with the emitter and the base through the openings. The two metal layers serve as base electrode and emitter electrode respectively. The collector region adjacent to the base region on the side of the latter facing away from the emitter either has uniform resistivity throughout or has a zone of relatively high resistivity at the emitter region and another zone of low resistivity away from the emitter region. The mesh-grid design of the embedded emitter region improves the high-frequency high-power ability of the device.

13 Claims, 10 Drawing Figures

SEMICONDUCTOR DEVICE WITH HIGH FREQUENCY, HIGH POWER OUTPUT

This is a continuation, of application Ser. No. 114,371, filed Feb. 10, 1971, which is a continuation application of Ser. No. 688,493, filed 12/6/67 now abandoned.

My invention relates to semiconductor devices, especially high-frequency high-power transistors.

Generally a high-frequency high-power transistor is to combine large current-carrying ability with good electrical characteristics at high frequency. For the latter reason particularly, the emitter capacitance of such transistors should be as small as possible. When a transistor is operated at high current levels, the bias voltage at the center of an emitter region apart from the base electrode is reduced because of the voltage drop resulting in the base region from the flow of base current through the base region. As a result, the current is distributed not to the center of the emitter region but to its outer or peripheral portions. This would make it desirable to give the emitter region a longest feasible peripheray to provide for large current-carrying ability. On the other hand, the emitter capacitance varies in proportion to the area of the whole emitter region, which would make it desirable to keep the area as small as possible for securing the desired small capacitance. Because of these conflicting desiderata the performance quality of a high-frequency power transistor depends upon the "figure of merit": $F=L/A$, wherein A is the area of the emitter region and L is the perimetric length of the emitter region. For best performance the figure of merit F should be as large as possible.

Several attempts have been made toward lengthening the perimeter L. Thus a complicated star-shaped emitter region and a comb-type emitter region have been proposed. For any given shape of the emitter region the value F increases with a decrease in size of the region. That is, the area of similar figures varies in proportion to the square of the length of corresponding parts. Hence when an emitter region of a certain shape is diminished to have one half the perimeter of the original, the area of the diminished region is reduced to one quarter of the original and the value of F is doubled. However, since the maximum value of the available emitter current varies in proportion to the emitter perimeter, a large current cannot flow if only the emitter region becomes small.

To cope with this limitation, another type of transistor which has large F value and which can carry large currents has been designed. This type of transistor known as the over-lay or OL-type transistor has its emitter region divided into many small pieces which are distributed over its base region. The total emitter region thus comprises many small islands (hereinafter referred to as "emitter small regions") connected in parallel by a metallic electrode. By virtue of this multi-island structure the OL-type transistor has a large F value and can carry a high output power. However, its production is complicated and requires extremely exacting manufacturing techniques. This is due not only to the minuteness of each emitter small region but also to the double structure of the base region. That is, a layer having the same conductivity type as the base region and a lower resistivity than the base region must be formed within the base region to surround each individual emitter small region. If this layer is not formed in the base region, the current is not distributed away from the base electrode to the peripheral portion of the emitter small region so that the purpose and significance of increasing the emitter periphery by dividing the emitter region into many small islands would be mostly lost. Accordingly OL-type transistors require one more fabricating process to form the above-mentioned layer of lower resistivity in addition to the processes applied for forming the base and the emitter regions. Moreover, when designing the transistor, sufficient space for the formation of the said layer must be provided at each emitter small region because, if this lower-resistivity layer directly contacts the emitter small region, the performance of the emitter-base junction will be impaired considerably.

The above-mentioned circumstances not only increase the manufacturing difficulties but also result in widening the spaces between the emitter small regions, thus limiting the number of emitter small regions that can be formed within a given, limited area of a semiconductor wafer.

It is an object of my invention to improve high-frequency high-power semiconductor devices so as to minimize the above-mentioned shortcomings and difficulties.

Another object of my invention is to provide a new semi-conductor device which can produce or carry a higher output power than conventional semiconductor devices of otherwise comparable kind and size.

A still further object of the invention is to provide a semiconductor device having an improved structure of a mesh-type emitter region and a metallic layer to connect in parallel each part of the base region surrounded by the emitter mesh region.

The foregoing and other objects, advantages and features of the invention will appear from, and will be mentioned in, the following description of embodiments thereof in conjunction with the accompanying drawing in which.

Figure 1:
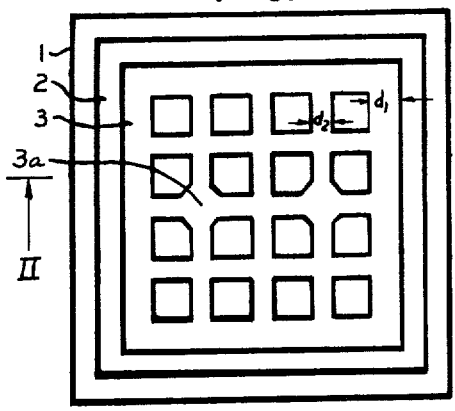
FIG. 1 is plan view of a transistor structure embodying the invention, at a manufacturing step when a base region and a mesh-type emitter region have been formed in the major surface of a semiconductive wafer and an insulating film (not shown) has been formed on the wafer.

In FIG. 1, the base region 2 and the emitter region 3 of a transistor are formed on the major surface area of a planar semiconductive wafer 1 consisting of silicon of a given conductivity type, for example N-type. The planar shape of the emitter region 3 is of the mesh-grid type. Although the emitter mesh-grid and the base region 2 are shown square, they may also be polygonal or they may be given a partially or entirely round shape. Furthermore, even if the mesh type is not uniform, the substance of the invention is not necessarily affected.

Figure 2:
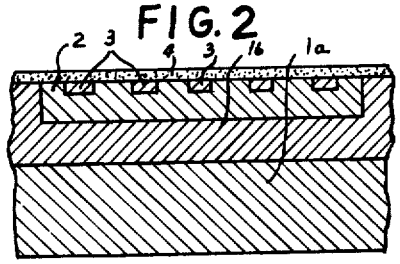
FIG. 2 is a section along the line II-II of FIG. 1 and partially cut away.

As shown, the width $d_1$ of the perimetric portion of the emitter mesh region 3 is somewhat larger than the width $d_2$ of the intermediate grid bars, and several intersection areas 3a and 3b are larger than others. The wider parts 3a and 3b facilitate bonding the electrodes as described hereinafter. In this embodiment, the semiconductor wafer 1 (hereinafter referred to as "substrate") is composed of two layers as shown in FIG. 2. One layer 1a has a lower resistivity, such as 0.005 ohm-cm. The other layer 1b has a higher resistivity, such as 2 ohm-cm. The base region 2 and the emitter region 3 are formed within the high-resistivity layer 1b.

In this example, a substrate having the double structure 1a, 1b shown in FIG. 2 is used because such a substrate is generally preferable for high-frequency power transistors; but if high output power is not required, a semiconductor wafer having the proper resistivity and uniform quality throughout may be used instead.

The base region 2 and the emitter region 3 are formed by the selective diffusion method conventional in the manufacture of planar-type semiconductor devices. Accordingly, the impurity determining each conductivity type (for example, boron for the base region and phosphorous for the emitter region) is diffused and penetrated into the substrate from the vapor phase. As also known for planar-type transistors, the base region 2 is diffused more deeply than the emitter region 3. Hence the base region 2 forms a coherent layer which extends in the interior of the wafer beneath all of the emitter region as is apparent from FIG. 2. The resistivities of the base and emitter regions need not differ from conventional values. They are, for example, $10^{-2}$ ohm-cm in the base region and $5 \times 10^{-4}$ ohm-cm in the emitter region.

The diffused surface of the substrate 1 is wholly coated with an insulating film 4 (FIG. 2) which covers and protects the exposed part of the PN junctions formed between the collector and the base, and between the base and the emitter. Besides, as well known, the insulating coating serves as a mask for the selective impurity indiffusion and for bonding the electrodes. The film 4 may be made of conventional silicon oxide, or silicon nitride and the like.

Figure 3:
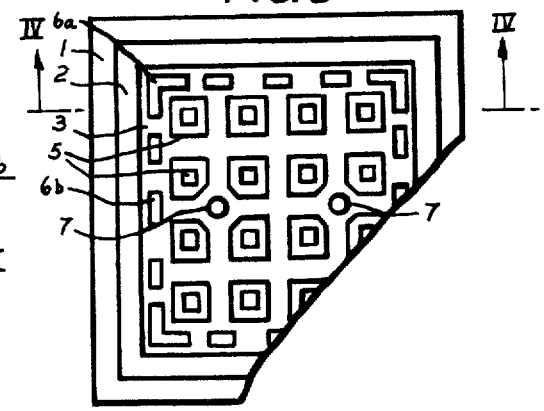
FIG. 3 is a partial plan view of the same structure at the manufacturing step next following the one of FIG. 1.
Figure 4:
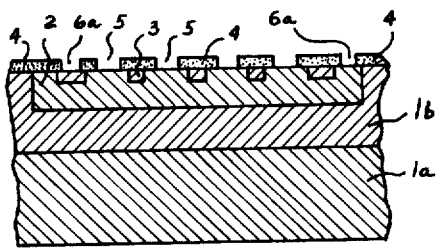
FIG. 4 shows part of a section along the line IV-IV in FIG. 3.

At the next process step, shown in FIG. 3, several openings are made at predetermined spots of the insulating coating 4 so that the emitter region 3 is exposed through the openings as apparent from FIG. 4. The openings 5 on the base region are square. Most of the openings on the emitter region are oblong as at 6b, but the openings 6a at the corners are L-shaped due to the joining of two oblong openings. There are also two circular openings 7. However, the shape of these openings is not limited to those shown but may be chosen to suit convenient manufacture.

Figure 5:
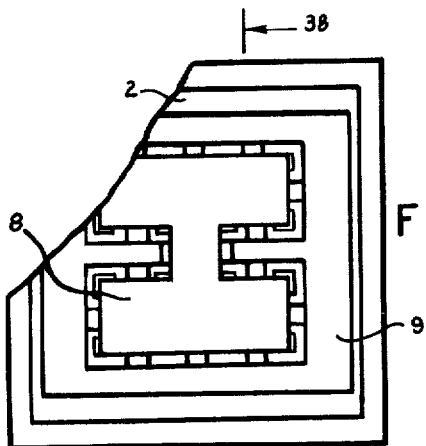
FIG. 5 is a plan view of the same structure at the manufacturing step next following the one of FIG. 3.
Figure 6:
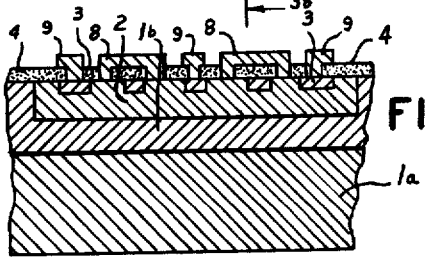
FIG. 6 is a section taken along the line VI-VI of FIG. 5 and partially cut away.
Figure 9:
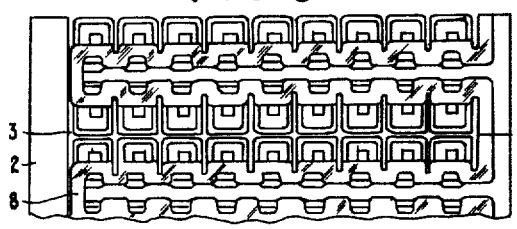
FIG. 9 is a plan view of a mesh emitter transistor (MET) made according to the invention and particularly shows an example of the configuration of one of the metallic layers that form the base electrodes, the illustration being drawn from a photograph of an actually produced specimen.

After producing the openings, aluminum is evaporated over the substrate and thus deposited on top of the insulating film 4. The deposited metal coating makes ohmic contact through the openings with the respective base and the emitter regions. Finally, after any unnecessary part of the vapor-deposited layer of aluminum is removed by the photo-etching process, the remaining portions which are to be the base electrode 8 and the emitter electrode 9 respectively, are separated from each other. This completes the transistor as shown in FIGS. 5 and 6. An example of the ultimate configuration of one of the metallic electrode coatings, namely the aluminum electrode 8 for the base region, is shown in FIG. 9.

After thus completing the transistor member proper, the transistor body is bonded to a stem as is customary for conventional transistors, the base electrode and the emitter electrode are connected to the stem leads by wires, and the member is encapsulated within a metallic shell.

As will be understood from the above explanation of the manufacturing process, a transistor according to the invention has a mesh-type emitter region and has the surface of its base region divided into many portions individually located in respective mesh windows and surrounded by the mesh-grid bars of the emitter region. When each electrode is bonded at several spots to the emitter region and to all or most of the surrounded base portions, the whole emitter region is kept at a uniform potential, and since all of its edge parts (except the outer perimetric part) are always adjacent to the base electrode, the current is distributed to the edge part. Although the transistor according to the invention has no double-structure base region as that of an OL-type transistor, it also affords a maximum value of available emitter current not inferior to that of an OL-type transistor and thus secures a high output power carrying ability.

The simplification in manufacture afforded by the invention denotes a remarkable improvement. As mentioned, OL-type transistors require one more process to form a low-resistivity layer between the base region and the emitter region. This process is so troublesome as to place exacting requirements upon precision and skill. The present invention obviates this additional process, thus reducing manufacturing trouble and cost. Besides, the substrate is used more effectively than in OL-type transistors. That is, the space between the emitter small regions of an OL-type transistor cannot be reduced beyond some extent because of the double structure of the base region. In contrast thereto, the emitter region (i.e., the width of the mesh-grid bars) in a transistor according to the invention can be made as narrow as manufacturing technique will permit, and the emitter perimeter can be made longer than in an OL-type transistor having the same substrate. Consequently a transistor embodying the invention can be made to carry a higher output power than an otherwise comparable OL-type transistor.

Although FIGS. 1 to 6 relate to an example whose emitter region is formed from the vapor phase by impurity indiffusion, the invention is also applicable to semiconductor devices with emitter regions formed by the alloying method. Since with the alloying method and emitter region is connected wholly by alloyed metal, there may be several openings 6a and 6b located at the edge of the emitter region in FIG. 3, whereas openings at the intersection, such as those shown at 7, become unnecessary. Accordingly, the emitter electrode and the base electrode can be given a simpler shape and the manufacturing process of these electrodes is correspondingly simplified.

Figure 7:
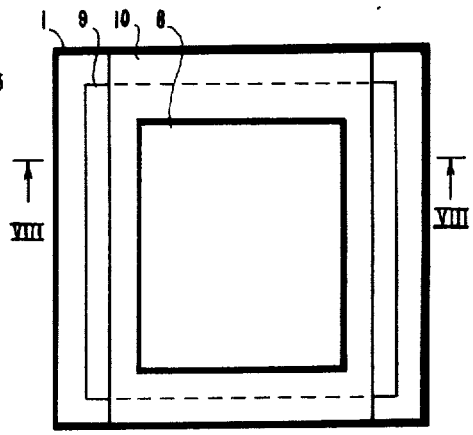
FIG. 7 is a plan view of another embodiment of the invention.
Figure 8:
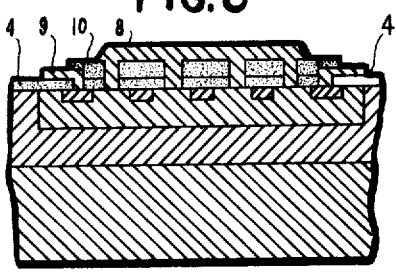
FIG. 8 shows part of a section along the line VIII-VIII of FIG. 7.

Although the number of the base portions surrounded by the mesh-type emitter region is sixteen in the illustrated example, there may be many more such mesh portions, for example several hundred or as many as in an OL-type transistor. Besides, the structure of the base and emitter electrodes need not be located on the surface previously described. For example, the electrodes may be formed by the following process. First a layer of aluminum is vapor deposited on the whole surface of the insulating film 4. Then the aluminum layer is removed except where the emitter electrode 9 (FIGS. 7, 8) is to remain. Thereafter a second insulating film 10 is formed on the part 9 as shown in FIGS. 7 and 8. Finally, the base electrode 8 is formed by evaporating a metal over and onto the second insulating film 10 through openings in the films 4 and 10. In this case, the metals used for the respective base and emitter electrodes need not necessarily consist of the same material. For example, they may consist of aluminum and silver respectively.

While silicon is mentioned above as the substrate material, germanium or GaAs and other semiconductive compounds may be used instead. Furthermore, the invention is analogously applicable to PNP-type transistors, although NPN-type transistors are described above.

By virtue of the fact that a mesh emitter transistor according to the invention can be given a longer emitter perimeter and a higher edge-to-area ratio of the emitter than attainable with other transistor structures, including OL-type transistors, the invention makes it possible to produce transistors which, in spite of a particularly small collector area, for example of 0.16 mm$^2$, provide for a high power output and a high gain such as about 10 W at 400 MHz with an input of about 2 W.

For example, the emitter perimeter-to-area ratio of a mesh emitter transistor according to the invention has been found to be about 1.3 times greater than that of an OL-type transistor for a maximum value F of the figure of merit.

Figure 10:
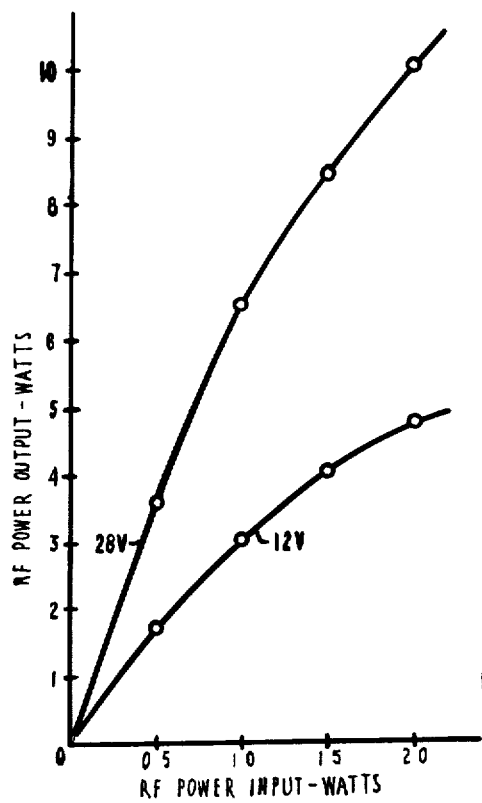
FIG. 10 is a graph of input versus output power resulting from measurements made with such a specimen transistor.

The output power as a function of the input of a specimen transistor according to the invention is represented by the diagram shown in FIG. 10. The transistor tested had an emitter perimeter of 24.3 mm and a collector area of 0.16 mm$^2$. The device was built into an epitaxially grown N-type layer and had a depth of 15 microns and a resistivity of 2 ohm-cm. Standard diffusion and photoresist-masking techniques were applied as described in the foregoing to produce the transistor. The typical characteristics of these transistors were as follows:

$V_{CBO} = 70$ V
$I_{CMAX} = 3.0$ A
$f_T = 550$ MHz at $V_C = 28$ V, $I_C$ 250 mA
$C_C = 5$pF at $V_C = 30$ V
$P_{OUT} = 10$ W at 400 MHz, input 2W, $V_{CE} = 28$ V.

Transistors according to those characteristics were tested for high-frequency power output and gain. The results are represented by the graph of FIG. 10 indicating RF power input in watts on the abscissa and RF power output in watts on the ordinates. The tests were made at a case temperature of 25° C with a frequency of 400 MHz. Curve 28 V was obtained with a collector-to-emitter voltage $V_{CE}$ of 28 Volts, curve 12 V with a corresponding voltage $V_{CE}$ = 12 volts.

The high figure of merit (F) afforded by virtue of the invention facilitates the satisfactory manufacture of transistors for high-frequency high-power purposes. For example, the long emitter perimeter permits applying a large emitter current and results in a low base resistance. The applicable small collector area corresponds to a desirable decrease in collector capacitance and ensures building of a uniformly thin base layer and obtaining a good yield in production.

To those skilled in the art it will be obvious from a study of this disclosure that the invention is amenable to various further modifications and hence can be given embodiments other than particularly illustrated and described herein, without departing from the essential features of the invention and within the scope of the claim annexed hereto.

I claim:

1. A semiconductor device comprising a semiconductor body having a region of one conductivity type, a second region adjacent to said first region and having a conductivity type opposed to that of said first region so as to form a first PN junction therewith, a third region embedded in said second region at the surface of the latter and having parallel to said surface a mesh-grid configuration for providing high frequency, high power outputs, said mesh-grid configuration having a plurality of strips forming therebetween mesh windows in which said second region forms a number of respective surface portions individually surrounded by said third region, said third region extending from said surface into said second region a distance short of said first junction and having said one conductivity type so as to form a second PN junction with said second region, an insulating coating disposed on said surface and covering at least one of said two junctions at said surface, said coating having openings on top of said respective second and third regions, and two metallic layers partly overlaid upon said insulating coating and insulated from each other, said metallic layers being in ohmic contact through said openings with said respective second and third regions, one of the metallic layers electrically connecting the parts of the second region within the meshes of the third region to each other in parallel and the other of the metallic layers being in individual contact with the third region at the spaced apart points of intersection formed by the strips of the third region.

2. In a semiconductor device according to claim 1, said second region having more than one-half the number of said individually surrounded surface portions in contact with one of said metallic layers and being thereby connected in parallel with one another.

3. In a semiconductor device according to claim 1, said two metallic layers consisting both of the same material.

4. In a semiconductor device according to claim 1, said two metallic layers consisting of different materials respectively.

5. In a semiconductor device according to claim 1, each of said three regions containing indiffused dopant.

6. In a semiconductor device according to claim 1, said two metallic layers being located on respectively different levels, and an insulating layer intermediate said two metallic layers.

7. In a semiconductor device according to claim 1, said insulating coating consisting substantially of a compound of said semiconductor material.

8. In a semiconductor device according to claim 1, said insulating coating being composed of a metallic oxide.

9. In a semiconductor device according to claim 1, said semiconductor body being a wafer of uniform resistivity throughout said first region.

10. A transistor comprising a semiconductor body having a collector region of one conductivity type, a base region of the other conductivity type adjacent to said collector region and forming therewith a first PN junction, a emitter region embedded in said base region at the surface thereof and having parallel to said surface a mesh-grid configuration for providing high frequency, high power outputs, said mesh-grid configuration having a plurality of strips forming therebetween mesh windows in which said base region forms respective surface portions individually surrounded by said mesh-grid emitter region, said emitter region extending from said surface into said base region a distance short of said first junction and having said one conductivity type so as to form a second PN junction with said base region, an insulating coating disposed on said surface and covering at least one of said two junctions at said surface, said coating having openings on top of said respective base and emitter regions, and two metallic layers partly overlaid upon said insulating coating and insulated from each other, said metallic layers being in ohmic contact through said openings with said respective base and emitter regions, one of the metallic layers electrically connecting the parts of the base region within the meshes of the emitter region to each other in parallel and the other of the metallic layers being in individual contact with the emitter region exclusively at the points of intersection formed by the strips of the emitter region.

11. In a transistor according to claim 10, said semiconductor body consisting of silicon, and said collector and emitter regions being of N-conductivity type.

12. In a transistor according to claim 11, said two metallic layers consisting substantially of aluminum.

13. A semiconductor device comprising a semiconductor substrate having one conduction type, a first planar region formed on one surface of said substrate and having a conduction type opposite to the conduction type of said substrate, a second planar region formed within said first planar region and having a depth therewithin smaller than the depth of said first region, the planar shape of said second region being mesh-grid formed of a plurality of intersecting strips, said second region having a conduction type identical to the conduction type of said substrate, an insulating film covering and protecting the surface of said substrate, and two metal layers formed on said insulating film and insulated from each other, said insulating film being formed with mutually spaced-apart holes overlying respective spaced-apart points of intersection of said plurality of strips of said second region and parts on said first region located within the meshes of said second region, said two metal layers having ohmic contact with said first and second region through said holes formed in said insulating film, one of said two metal layers connecting the parts of said first region within the meshes of said second region in parallel and the other of said two metal layers being in contact with said second region exclusively at said spaced-apart points of intersection formed by the strips of said second region.

* * * * *